(12) United States Patent
Schlub et al.

(10) Patent No.: US 8,466,839 B2
(45) Date of Patent: Jun. 18, 2013

(54) ELECTRONIC DEVICES WITH PARASITIC ANTENNA RESONATING ELEMENTS THAT REDUCE NEAR FIELD RADIATION

(75) Inventors: Robert W. Schlub, Campbell, CA (US); David T. Amm, Sunnyvale, CA (US); Omar S. Leung, Palo Alto, CA (US); Brian M. King, Santa Cruz, CA (US); Qingxiang Li, Mountain View, CA (US); Enrique Ayala Vazquez, Watsonville, CA (US); Rodney Andres Gomez Angulo, Sunnyvale, CA (US); Yi Jiang, Sunnyvale, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 481 days.

(21) Appl. No.: 12/632,697

(22) Filed: Dec. 7, 2009

(65) Prior Publication Data

US 2011/0012794 A1    Jan. 20, 2011

Related U.S. Application Data

(60) Provisional application No. 61/226,684, filed on Jul. 17, 2009.

(51) Int. Cl.
*H01Q 1/24*    (2006.01)
(52) U.S. Cl.
USPC .......................... 343/702; 343/872; 343/873
(58) Field of Classification Search
USPC .......................................... 343/702, 872, 873
See application file for complete search history.

(56) References Cited

U.S. PATENT DOCUMENTS

| 5,337,353 | A | 8/1994 | Boie et al. |
| 5,463,406 | A | 10/1995 | Vannatta et al. |
| 5,650,597 | A | 7/1997 | Redmayne |
| 5,826,458 | A | 10/1998 | Little |

(Continued)

FOREIGN PATENT DOCUMENTS

| CN | 1343380 | 4/2002 |
| CN | 101330162 | 12/2008 |

(Continued)

OTHER PUBLICATIONS

U.S. Appl. No. 12/061,159, filed Apr. 2, 2008, Ligtenberg et al.

(Continued)

*Primary Examiner* — Dieu H Duong
(74) *Attorney, Agent, or Firm* — Treyz Law Group; G. Victor Treyz; Chih-Yun Wu

(57) ABSTRACT

Antennas are provided for electronic devices such as portable computers. An electronic device may have a housing in which an antenna is mounted. The housing may be formed of conductive materials. A dielectric antenna window may be mounted in the housing to allow radio-frequency signals to be transmitted from the antenna and to allow the antenna to receive radio-frequency signals. Near-field radiation limits may be satisfied by reducing transmit power when an external object is detected in the vicinity of the dielectric antenna window and the antenna. A proximity sensor may be used in detecting external objects. A parasitic antenna resonating element may be interposed between the antenna resonating element and the dielectric antenna window to minimize near-field radiation hotspots. The parasitic antenna resonating element may be formed using a capacitor electrode for the proximity sensor. A ferrite layer may be interposed between the parasitic element and the antenna window.

4 Claims, 13 Drawing Sheets

U.S. PATENT DOCUMENTS

| | | | |
|---|---|---|---|
| 5,854,972 A | 12/1998 | Pennock et al. | |
| 5,864,316 A | 1/1999 | Bradley et al. | |
| 5,905,467 A | 5/1999 | Narayanaswamy et al. | |
| 5,956,626 A | 9/1999 | Kaschke et al. | |
| 6,329,958 B1 | 12/2001 | McLean et al. | |
| 6,380,899 B1 | 4/2002 | Madsen et al. | |
| 6,408,193 B1 | 6/2002 | Katagishi et al. | |
| 6,456,856 B1 | 9/2002 | Werling et al. | |
| 6,529,088 B2 | 3/2003 | Lafleur et al. | |
| 6,590,539 B2 | 7/2003 | Shinichi | |
| 6,611,227 B1 | 8/2003 | Nebiyeloul-Kifle et al. | |
| 6,657,595 B1 | 12/2003 | Phillips et al. | |
| 6,678,532 B1 | 1/2004 | Mizoguchi | |
| 6,879,293 B2 * | 4/2005 | Sato | 343/702 |
| 6,978,121 B1 | 12/2005 | Lane et al. | |
| 6,985,113 B2 | 1/2006 | Nishimura et al. | |
| 7,016,686 B2 | 3/2006 | Spaling | |
| 7,039,435 B2 | 5/2006 | McDowell et al. | |
| 7,109,945 B2 | 9/2006 | Mori | |
| 7,113,087 B1 | 9/2006 | Casebolt | |
| 7,146,139 B2 | 12/2006 | Nevermann | |
| 7,499,722 B2 | 3/2009 | McDowell et al. | |
| 7,522,846 B1 | 4/2009 | Lewis et al. | |
| 7,633,076 B2 | 12/2009 | Huppi et al. | |
| 7,826,875 B2 | 11/2010 | Karaoguz et al. | |
| 7,834,813 B2 | 11/2010 | Caimi et al. | |
| 2002/0027474 A1 | 3/2002 | Bonds | |
| 2002/0060645 A1 | 5/2002 | Shinichi | |
| 2002/0094789 A1 | 7/2002 | Harano | |
| 2002/0123309 A1 | 9/2002 | Collier et al. | |
| 2003/0062907 A1 | 4/2003 | Nevermann | |
| 2003/0186728 A1 | 10/2003 | Manjo | |
| 2003/0197597 A1 | 10/2003 | Bahl et al. | |
| 2003/0210203 A1 | 11/2003 | Phillips et al. | |
| 2003/0218993 A1 | 11/2003 | Moon et al. | |
| 2004/0176083 A1 | 9/2004 | Shiao et al. | |
| 2004/0222926 A1 | 11/2004 | Kontogeorgakis et al. | |
| 2005/0168384 A1 * | 8/2005 | Wang et al. | 343/700 MS |
| 2005/0245204 A1 | 11/2005 | Vance | |
| 2006/0161871 A1 | 7/2006 | Hotelling et al. | |
| 2006/0232468 A1 | 10/2006 | Parker et al. | |
| 2006/0244663 A1 | 11/2006 | Fleck et al. | |
| 2007/0188375 A1 | 8/2007 | Richards et al. | |
| 2007/0262909 A1 * | 11/2007 | Chang et al. | 343/702 |
| 2008/0165063 A1 | 7/2008 | Schlub et al. | |
| 2008/0248837 A1 | 10/2008 | Kunkel | |
| 2008/0309836 A1 * | 12/2008 | Sakama et al. | 349/1 |
| 2008/0316120 A1 * | 12/2008 | Hirota et al. | 343/702 |
| 2009/0000023 A1 | 1/2009 | Wegelin et al. | |
| 2009/0096683 A1 | 4/2009 | Rosenblatt et al. | |
| 2009/0174611 A1 | 7/2009 | Schlub et al. | |
| 2009/0295648 A1 | 12/2009 | Dorsey et al. | |
| 2010/0167672 A1 | 7/2010 | Ahn et al. | |
| 2011/0012793 A1 | 1/2011 | Amm et al. | |
| 2011/0212746 A1 | 9/2011 | Sarkar et al. | |

FOREIGN PATENT DOCUMENTS

| | | |
|---|---|---|
| DE | 10035935 A1 * | 1/2002 |
| EP | 0 564 164 | 10/1993 |
| EP | 1298809 | 4/2003 |
| EP | 1324425 | 7/2003 |
| EP | 1 469 550 | 10/2004 |
| EP | 1 524 774 | 4/2005 |
| EP | 1564896 | 8/2005 |
| GB | 2 380 359 | 4/2003 |
| JP | 2003179670 | 6/2003 |
| JP | 2003209483 | 7/2003 |
| JP | 2004005516 | 1/2004 |
| JP | 2009032570 | 2/2009 |
| WO | 0131733 | 5/2001 |
| WO | 02/05443 | 1/2002 |
| WO | 2005112280 | 11/2005 |
| WO | WO 2007116790 A1 * | 10/2007 |
| WO | 2008/078142 | 7/2008 |
| WO | WO 2009022387 A1 * | 2/2009 |
| WO | 2009149023 | 12/2009 |

OTHER PUBLICATIONS

U.S. Appl. No. 11/969,684, filed Jan. 4, 2008, Schlub et al.
U.S. Appl. No. 12/110,260, filed Apr. 25, 2008, Sorenson et al.
U.S. Appl. No. 12/132,549, filed Jun. 3, 2008, Dorsey et al.
U.S. Appl. No. 12/632,695, filed Dec. 7, 2009, Amm et al.
U.S. Appl. No. 12/207,326, filed Sep. 9, 2008, Caballero et al.
U.S. Appl. No. 12/422,196, filed Apr. 10, 2009, John G. Dorsey.
"CapTouch Programmable Controller for Single-Electrode Capacitance Sensors", AD7147 Data Sheet Rev. B, [online], Analog Devices, Inc., [retrieved on Dec. 7, 2009], <URL: http://www.analog.com/static/imported-files/data_sheets/AD7147.pdf>.
Pance, Aleksander, et al. U.S. Appl. No. 12/861,640, filed Aug. 23, 2010.

* cited by examiner

ELECTRONIC DEVICES WITH PARASITIC ANTENNA RESONATING ELEMENTS THAT REDUCE NEAR FIELD RADIATION

This application claims the benefit of provisional patent application No. 61/226,684, filed Jul. 17, 2009, which is hereby incorporated by reference herein in its entirety.

BACKGROUND

This relates generally to antennas, and, more particularly, to antennas for electronic devices.

Electronic devices such as portable computers and handheld electronic devices are becoming increasingly popular. Devices such as these are often provided with wireless communications capabilities. For example, electronic devices may use long-range wireless communications circuitry such as cellular telephone circuitry to communicate using cellular telephone bands at 850 MHz, 900 MHz, 1800 MHz, and 1900 MHz (e.g., the main Global System for Mobile Communications or GSM cellular telephone bands). Long-range wireless communications circuitry may also be used handle the 2100 MHz band and other bands. Electronic devices may use short-range wireless communications links to handle communications with nearby equipment. For example, electronic devices may communicate using the WiFi® (IEEE 802.11) bands at 2.4 GHz and 5 GHz (sometimes referred to as local area network bands) and the Bluetooth® band at 2.4 GHz.

It can be difficult to incorporate antennas successfully into an electronic device. Some electronic devices are manufactured with small form factors, so space for antennas is limited. In many electronic devices, the presence of electronic components in the vicinity of an antenna serves as a possible source of electromagnetic interference. Antenna operation can also be blocked by conductive structures. This can make it difficult to implement an antenna in an electronic device that contains conductive housing walls or other conductive structures that can potentially block radio-frequency signals.

It would therefore be desirable to be able to provide improved antennas for wireless electronic devices.

SUMMARY

Antenna structures in an electronic device may be used in transmitting and receiving radio-frequency signals. For example, single band and multiband antennas may be formed. Each antenna may have an antenna resonating element. The antenna resonating elements may be based on inverted-F designs, slot configurations, or other antenna resonating element arrangements. Each antenna may also have a parasitic antenna resonating element formed from one or more conductive members.

The electronic devices may have conductive housings. A portion of the conductive housing in each device may serve as antenna ground. An antenna may be fed using a positive antenna feed terminal coupled to the antenna resonating element and a ground antenna feed terminal coupled to the conductive housing.

The antenna resonating element may be mounted adjacent to an antenna window in the conductive housing. During operation, the antenna may induce localized currents in the conductive housing. These currents can exhibit hotspots that are associated with the potential radiation of relatively concentrated amounts of electromagnetic radiation into the surrounding environment.

To reduce the strength of transmitted radio-frequency signals in the immediate vicinity of an electronic device, the electronic device may be provided with a proximity sensor. The proximity sensor may detect when a human body part or other external object comes within a given distance of the electronic device and antenna. When the presence of an external object in the vicinity of the antenna is detected, the transmit power of the device may be reduced to ensure that radiation transmission levels are sufficiently low to meet regulatory limits for near field radiation powers. When the external object is no longer present, transmit powers may increased.

Further features of the invention, its nature and various advantages will be more apparent from the accompanying drawings and the following detailed description of the preferred embodiments.

DETAILED DESCRIPTION

Figure 1:
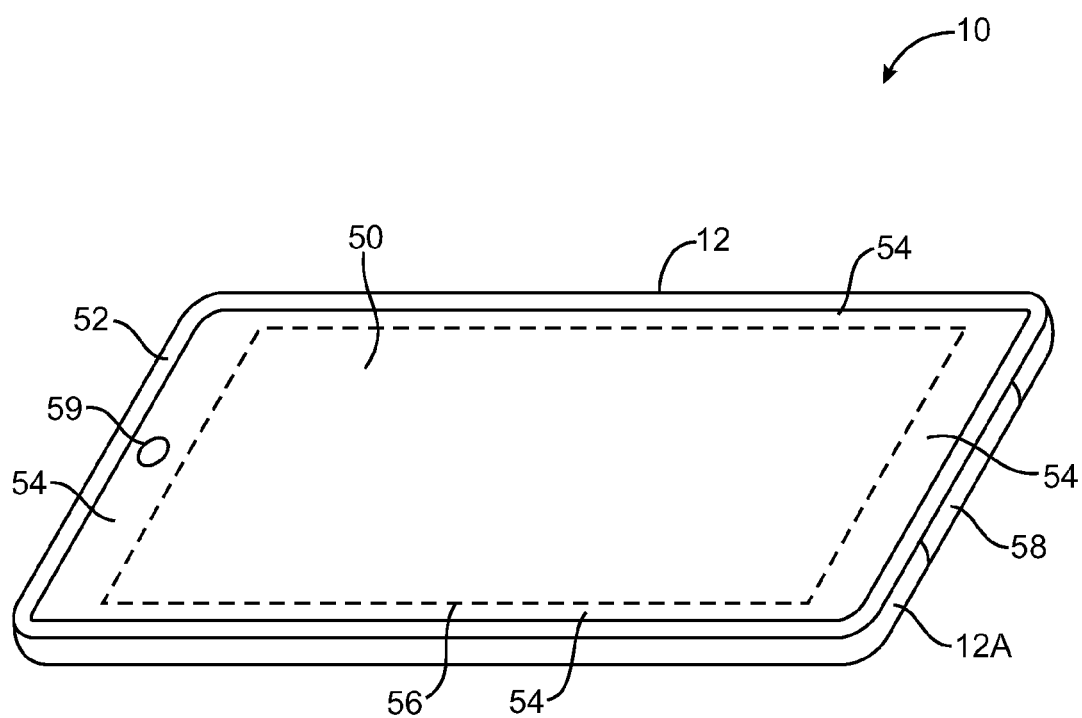
FIG. 1 is a front perspective view of an illustrative electronic device with an antenna having a parasitic antenna resonating element in accordance with an embodiment of the present invention.

Electronic devices may be provided with wireless communications circuitry. The wireless communications circuitry may be used to support wireless communications in one or more wireless communications bands. For example, the wireless communications circuitry may transmit and receive signals in cellular telephone bands.

To satisfy consumer demand for small form factor wireless devices, manufacturers are continually striving to reduce the size of components that are used in these devices while providing enhanced functionality. Particularly in configurations in which an electronic device is used in transmitting and receiving radio-frequency signals in cellular telephone bands and other communications bands that have relatively wide bandwidths, it can be challenging to meet desired antenna performance criteria in a compact device. High transmit powers and wide antenna bandwidths can be desirable to ensure adequate signal strength during communications, but these attributes may give rise to challenges with controlling emitted radiation levels.

It is generally impractical to completely shield a user of an electronic device from transmitted radio-frequency signals. For example, conventional cellular telephone handsets generally emit signals in the vicinity of a user's head during telephone calls. Government regulations limit radio-frequency signal powers. At the same time, wireless carriers require that the user equipment that is used in their networks be capable of producing certain minimum radio-frequency powers so as to ensure satisfactory operation of the equipment.

In many jurisdictions, specific absorption rate (SAR) standards are in place that impose maximum energy absorption limits on handset manufacturers. These standards place restrictions on the amount of radiation that may be emitted at any particular point within a given distance of the antenna. Particular attention is given to radiation limits at distances of about 1-20 mm from the device, where users are likely to place a body part near an antenna.

Satisfactory antenna performance and regulatory compliance can be ensured by using an antenna does not exhibit local "hotspots" in which emitted radiation exceeds desired power levels. A proximity sensor may also be used to detect when an external object such as a user's body is in the vicinity of the antenna. When the presence of the external object is detected, transmitted power levels can be reduced.

Hotspots can be minimized by proper antenna design. If desired, a parasitic antenna resonating element may be placed in the vicinity of a device antenna to help smooth out near-field emitted radiation patterns. Electromagnetic shielding arrangements may also be implemented using ferrite tape or other high permeability materials.

Any suitable electronic devices may be provided with antennas that use these configurations. As an example, antennas may be formed in electronic devices such as desktop computers, portable computers such as laptop computers and tablet computers, handheld electronic devices such as cellular telephones, etc. With one suitable configuration, which is sometimes described herein as an example, the antennas are formed in relatively compact electronic devices in which interior space can be valuable. These compact devices may be portable electronic devices.

Portable electronic devices that may be provided with antennas include laptop computers and small portable computers such as ultraportable computers, netbook computers, and tablet computers. Portable electronic devices may also be somewhat smaller devices. Examples of smaller portable electronic devices that may be provided with antennas include cellular telephones, wrist-watch devices, pendant devices, headphone and earpiece devices, and other wearable and miniature devices.

Space is at a premium in portable electronic devices and housings for these devices are sometimes constructed from conductive materials that block antenna signals. Arrangements in which antenna structures are formed behind an antenna window can help address these challenges. Antenna windows may be formed in conductive housing walls by forming a dielectric antenna window structure from an opening in the conductive housing wall. If desired, slot-based antenna windows may be formed in conductive housing walls. In a slot-based antenna window, the window region is defined by a pattern of window slots. Arrangements in which dielectric antenna windows are used are sometimes described herein as an example.

An antenna resonating element may be formed under the antenna window. Portions of the conductive housing or other conductive structures may serve as antenna ground. The antenna can be fed using a positive antenna feed terminal that is coupled to the antenna resonating element and using a ground antenna feed terminal that is coupled to the conductive housing. During operation, radio-frequency signals for the antenna can pass through the antenna window. The parasitic antenna resonating element and ferrite tape may help to reduce near-field hotspots.

A proximity-based antenna power control circuit may also be used to reduce near-field electromagnetic radiation intensities when the presence of an external object is detected in the vicinity of the antenna. The proximity-based antenna power control circuit may be based on a capacitive proximity sensor. Sensor electrodes for the capacitive proximity sensor may be placed in the vicinity of the antenna. If desired, a conductive structure such as a sensor electrode may serve both as part of a capacitive sensor and as part of a parasitic antenna resonating element. With this type of arrangement, the sensor electrode may be used in reducing near-field radiation hotspots while simultaneously serving as part of a capacitor electrode that detects the presence of nearby external objects for a proximity detector.

Antenna structures with configurations such as these can be mounted on any suitable exposed portion of a portable electronic device. For example, antennas can be provided on the front or top surface of the device. In a tablet computer, cellular telephone, or other device in which the front of the device is all or mostly occupied with conductive structures such as a touch screen display, it may be desirable to form at least part of the antenna window on a rear device surface. Other configurations are also possible (e.g., with antennas mounted in more confined locations, on device sidewalls, etc.). The use of antenna mounting locations in which at least part of a dielectric antenna window is formed in a conductive rear housing surface is sometimes described herein as an example, but, in general, any suitable antenna mounting location may be used in an electronic device if desired.

An illustrative portable device that may include an antenna is shown in FIG. 1. As shown in FIG. 1, device 10 may be a relatively thin device such as a tablet computer. Device 10 may have display such as display 50 mounted on its front (top) surface. Housing 12 may have curved portions that form the edges of device 10 and a relatively planar portion that forms the rear surface of device 10 (as an example). An antenna window such as antenna window 58 may be formed in housing 12. Antenna structures for device 10 may be formed in the vicinity of antenna window 58.

Device 10 may have user input-output devices such as button 59. Display 50 may be a touch screen display that is used in gathering user touch input. The surface of display 50 may be covered using a dielectric member such as a planar cover glass member. The central portion of display 50 (shown as region 56 in FIG. 1) may be an active region that is sensitive to touch input. The peripheral regions of display 50 such as regions 54 may be inactive regions that are free from touch sensor electrodes. A layer of material such as an opaque ink may be placed on the underside of display 50 in peripheral regions 54 (e.g., on the underside of the cover glass). This layer may be transparent to radio-frequency signals. The conductive touch sensor electrodes in region 56 may tend to block radio-frequency signals. However, radio-frequency signals may pass through the cover glass and opaque ink in inactive display regions 54 (as an example). Radio-frequency signals may also pass through antenna window 58.

Housing 12 may be formed from one or more structures. For example, housing 12 may include an internal frame and planar housing walls that are mounted to the frame. Housing 12 may also be formed from a unitary block of material such as a cast or machined block of aluminum. Arrangements that use both of these approaches may also be used if desired.

Housing 12 may be formed of any suitable materials including plastic, wood, glass, ceramics, metal, or other suitable materials, or a combination of these materials. In some situations, portions of housing 12 may be formed from a dielectric or other low-conductivity material, so as not to disturb the operation of conductive antenna elements that are located in proximity to housing 12. In other situations, housing 12 may be formed from metal elements. An advantage of forming housing 12 from metal or other structurally sound conductive materials is that this may improve device aesthetics and may help improve durability and portability.

With one suitable arrangement, housing 12 may be formed from a metal such as aluminum. Portions of housing 12 in the vicinity of antenna window 58 may be used as antenna ground. Antenna window 58 may be formed from a dielectric material such as polycarbonate (PC), acrylonitrile butadiene styrene (ABS), a PC/ABS blend, or other plastics (as examples). Window 58 may be attached to housing 12 using adhesive, fasteners, or other suitable attachment mechanisms. To ensure that device 10 has an attractive appearance, it may be desirable to form window 58 so that the exterior surfaces of window 58 conform to the edge profile exhibited by housing 12 in other portions of device 10. For example, if housing 12 has straight edges 12A and a flat bottom surface, window 58 may be formed with a right-angle bend and vertical sidewalls. If housing 12 has curved edges 12A, window 58 may have a similarly curved surface.

Figure 2:
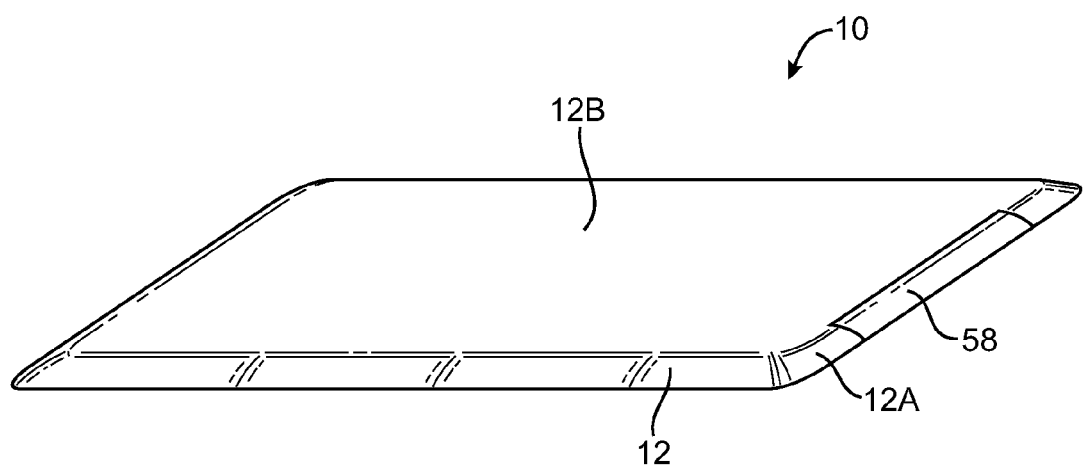
FIG. 2 is a rear perspective view of an illustrative electronic device with an antenna having a parasitic antenna resonating element in accordance with an embodiment of the present invention.

FIG. 2 is a rear perspective view of device 10 of FIG. 1 showing how device 10 may have a relatively planar rear surface 12B and showing how antenna window 58 may be rectangular in shape with curved portions that match the shape of curved housing edges 12A.

Figure 3:
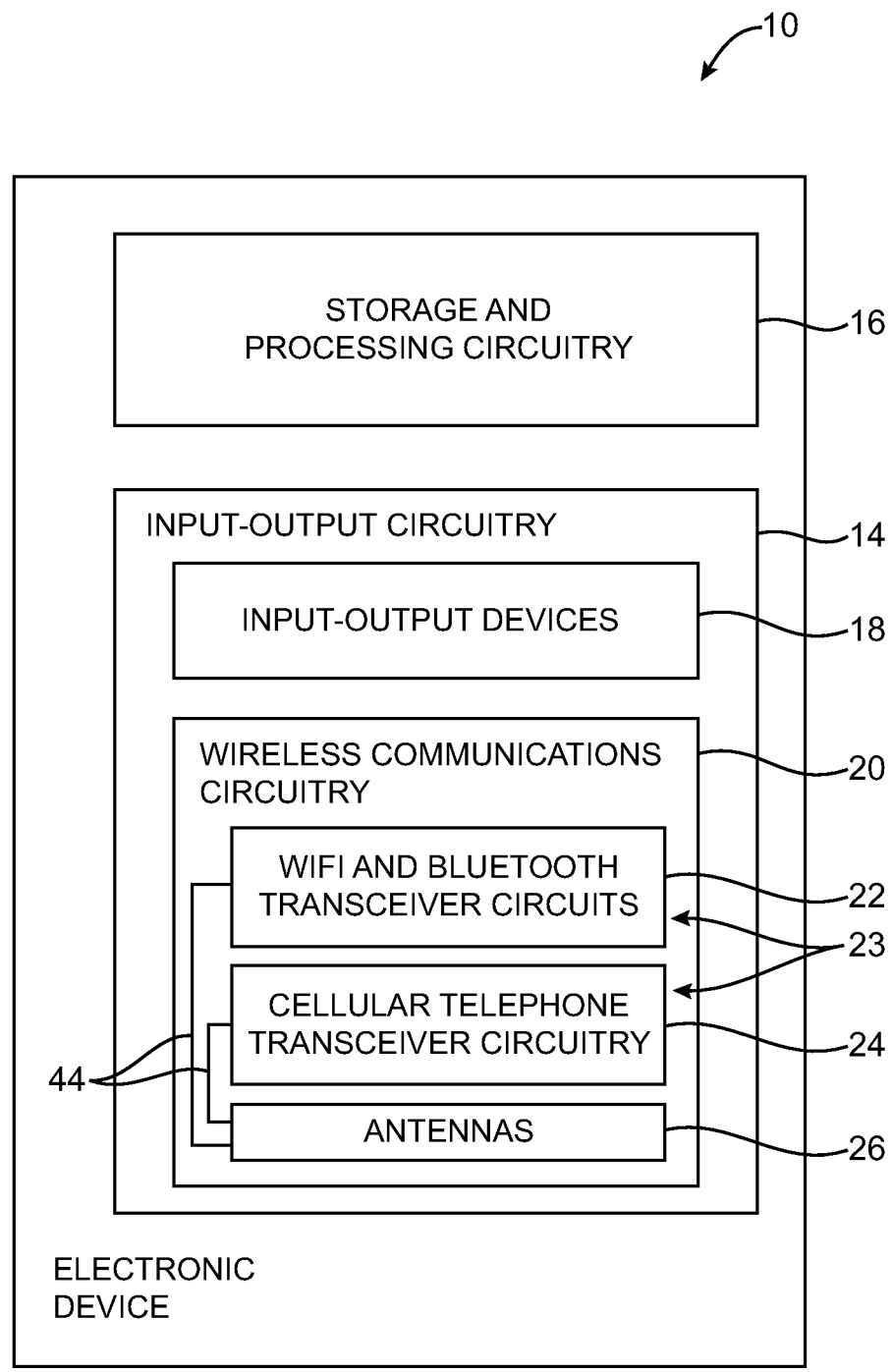
FIG. 3 is a schematic diagram of an illustrative electronic device with antenna structures in accordance with an embodiment of the present invention.

A schematic diagram of device 10 showing how device 10 may include one or more antennas 26 and transceiver circuits that communicate with antennas 26 is shown in FIG. 3. Electronic device 10 of FIG. 3 may be a portable computer such as a laptop computer, a portable tablet computer, a mobile telephone, a mobile telephone with media player capabilities, a handheld computer, a remote control, a game player, a global positioning system (GPS) device, a desktop computer, a combination of such devices, or any other suitable electronic device.

As shown in FIG. 3, electronic device 10 may include storage and processing circuitry 16. Storage and processing circuitry 16 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 16 may be used to control the operation of device 10. Processing circuitry 16 may be based on a processor such as a microprocessor and other suitable integrated circuits. With one suitable arrangement, storage and processing circuitry 16 may be used to run software on device 10, such as internet browsing applications, voice-over-internet-protocol (VOIP) telephone call applications, email applications, media playback applications, operating system functions, control functions for controlling radio-frequency power amplifiers and other radio-frequency transceiver circuitry, etc. Storage and processing circuitry 16 may be used in implementing suitable communications protocols. Communications protocols that may be implemented using storage and processing circuitry 16 include internet protocols, cellular telephone protocols, wireless local area network protocols (e.g., IEEE 802.11 protocols—sometimes referred to as WiFi®), protocols for other short-range wireless communications links such as the Bluetooth® protocol, etc.

Input-output circuitry 14 may be used to allow data to be supplied to device 10 and to allow data to be provided from device 10 to external devices. Input-output devices 18 such as touch screens and other user input interface are examples of input-output circuitry 14. Input-output devices 18 may also include user input-output devices such as buttons, joysticks, click wheels, scrolling wheels, touch pads, key pads, keyboards, microphones, cameras, etc. A user can control the operation of device 10 by supplying commands through such user input devices. Display and audio devices may be included in devices 18 such as liquid-crystal display (LCD) screens, light-emitting diodes (LEDs), organic light-emitting diodes (OLEDs), and other components that present visual information and status data. Display and audio components in input-output devices 18 may also include audio equipment such as speakers and other devices for creating sound. If desired, input-output devices 18 may contain audio-video interface equipment such as jacks and other connectors for external headphones and monitors.

Wireless communications circuitry 20 may include radio-frequency (RF) transceiver circuitry 23 formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Wireless communications circuitry 20 may include radio-frequency transceiver circuits for handling multiple radio-frequency communications bands. For example, circuitry 20 may include transceiver circuitry 22 that handles 2.4 GHz and 5 GHz bands for WiFi (IEEE 802.11) communications and the 2.4 GHz Bluetooth communications band. Circuitry 20 may also include cellular telephone transceiver circuitry 24 for handling wireless communications in cellular telephone bands such as the GSM bands at 850 MHz, 900 MHz, 1800 MHz, and 1900 MHz, and the 2100 MHz data band (as examples). Wireless communications circuitry 20 can include circuitry for other short-range and long-range wireless links if desired. For example, wireless communications circuitry 20 may include global positioning system (GPS) receiver equipment, wireless circuitry for receiving radio and television signals, paging circuits, etc. In WiFi and Bluetooth links and other short-range wireless links, wireless signals are typically used to convey data over tens or hundreds of feet. In cellular telephone links and other long-range links, wireless signals are typically used to convey data over thousands of feet or miles.

Wireless communications circuitry 20 may include antennas 26 such as the antenna located adjacent to antenna window 58 of FIGS. 1 and 2. Antennas 26 may be single band antennas that each cover a particular desired communications band or may be multiband antennas. A multiband antenna may be used, for example, to cover multiple cellular telephone communications bands. If desired, a dual band antenna may be used to cover two WiFi bands (e.g., 2.4 GHz and 5 GHz). Different types of antennas may be used for different bands and combinations of bands. For example, it may be desirable to form a dual band antenna for forming a local wireless link antenna, a multiband antenna for handling cellular telephone communications bands, and a single band antenna for forming a global positioning system antenna (as examples).

Transmission line paths 44 may be used to convey radio-frequency signals between transceivers 22 and 24 and antennas 26. Radio-frequency transceivers such as radio-frequency transceivers 22 and 24 may be implemented using one or more integrated circuits and associated components (e.g., switching circuits, matching network components such as discrete inductors, capacitors, and resistors, and integrated circuit filter networks, etc.). These devices may be mounted on any suitable mounting structures. With one suitable arrangement, transceiver integrated circuits may be mounted on a printed circuit board. Paths 44 may be used to interconnect the transceiver integrated circuits and other components on the printed circuit board with antenna structures in device 10. Paths 44 may include any suitable conductive pathways over which radio-frequency signals may be conveyed including transmission line path structures such as coaxial cables, microstrip transmission lines, etc.

Antennas 26 may, in general, be formed using any suitable antenna types. Examples of suitable antenna types for antennas 26 include antennas with resonating elements that are formed from patch antenna structures, inverted-F antenna structures, closed and open slot antenna structures, loop antenna structures, monopoles, dipoles, planar inverted-F antenna structures, hybrids of these designs, etc. With one suitable arrangement, which is sometimes described herein as an example, part of housing 12 (e.g., the portion of housing 12 in the vicinity of antenna window 58) may form a ground structure for the antenna associated with window 58.

Figure 4:
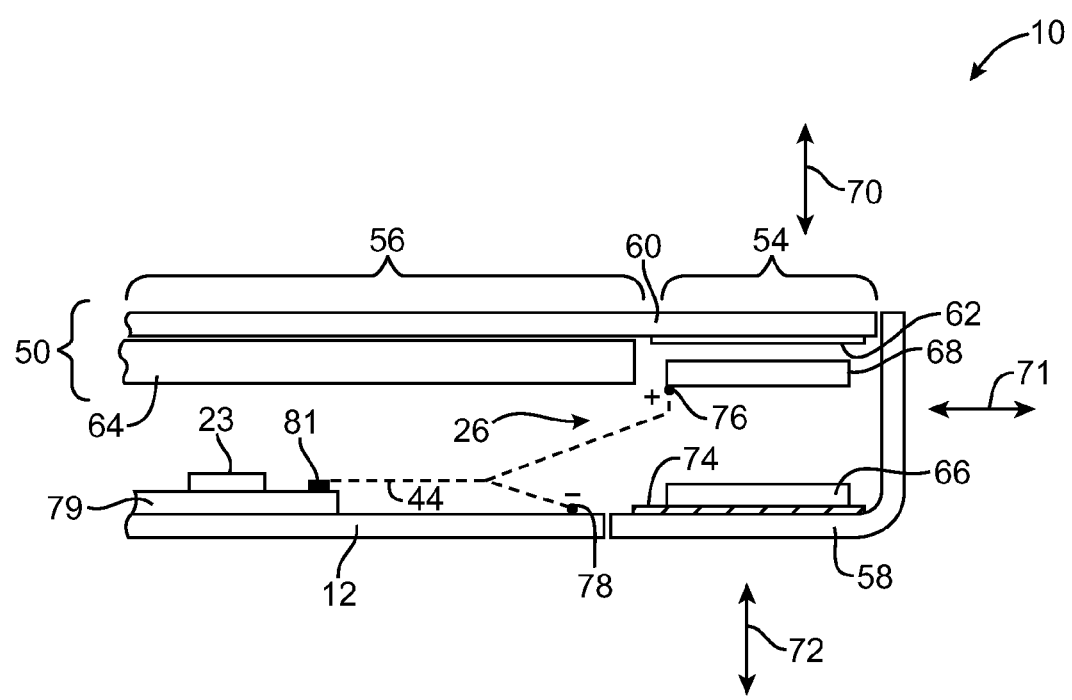
FIG. 4 is a cross-sectional side view of an illustrative electronic device with an antenna in accordance with an embodiment of the present invention.

A cross-sectional view of device 10 in the vicinity of antenna window 58 is shown in FIG. 4. As shown in FIG. 4, antenna 26 may have antenna resonating element 68 (e.g., a patch antenna resonating element, a single arm inverted-F antenna structure, a dual-arm inverted-F antenna structure, or other suitable multi-arm or single arm inverted-F antenna structures, closed and open slot antenna structures, loop antenna structures, monopoles, dipoles, planar inverted-F antenna structures, hybrids of these designs, etc. Housing 12 may serve as antenna ground for antenna 26.

Antenna 26 may also have a parasitic antenna resonating element formed from one or more conductive structures such as structure 66. If desired, a layer of ferrite material such as ferrite tape 74 may be placed between antenna resonating element 68 and window 58 to help reduce near-field signal strengths without over-attenuating far-field signals. In the example of FIG. 4, ferrite tape 74 has been placed under parasitic antenna resonating element 66.

As shown in FIG. 4, antenna 26 may be fed using a positive antenna feed terminal that is coupled to antenna resonating element 68 such as positive antenna feed terminal 76 and a ground antenna feed terminal that is coupled to housing 12 such as ground antenna feed terminal 78.

Antenna resonating element 68 may be placed in the vicinity of dielectric antenna window 58 as shown in FIG. 4, so that radio-frequency signals can be conveyed through window 58 (e.g., in directions 72 and 71). Radio-frequency signals can also be conveyed through a transparent display cover member such as cover glass 60. Display 50 may have an active region such as region 56 in which cover glass 60 has underlying conductive structure such as display panel module 64. The structures in display panel 64 such as touch sensor electrodes and active display pixel circuitry may be conductive and may therefore attenuate radio-frequency signals. In region 54, however, display 50 may be inactive (i.e., panel 64 may be absent). An opaque ink such as ink 62 may be formed on the underside of transparent cover glass 60 in region 54 to block antenna resonating element 68 from view. Ink 62 and the dielectric material of cover member 60 in region 54 may be sufficiently transparent to radio-frequency signals that radio-frequency signals can be conveyed through these structures in directions 70.

Any suitable conductive materials may be used in forming antenna structures for antenna 26. With one suitable arrangement, the conductive structures for antenna resonating element 68 and parasitic antenna resonating element 66 may each be formed from conductive traces on a dielectric support. The conductive traces may be formed from copper or other metals (as an example) to help ensure low losses and good performance at radio frequencies. The dielectric supports for these structures may be printed circuit boards or plastic members. Plastic support structures may also be used to support printed circuit boards. In general, printed circuit boards may be rigid or flexible. Rigid printed circuit boards may be formed from epoxy (e.g., FR4) or other dielectric substrates. Flexible printed circuit boards ("flex circuits") may be formed from flexible polymer sheets such as polyimide sheets or other flexible dielectrics. When an antenna structure is formed from a sheet of flex circuit substrate, the flex circuit may, if desired, be flexed to form a curved surface (e.g., to adapt to a curved plastic support structure). With rigid substrate arrangements, the printed circuit board is typically flat.

Antenna structures such as conductive structure 66 may serve multiple functions. For example, because structure 66 is adjacent to antenna resonating element 68, structure 66 influences the electromagnetic behavior of antenna 26 and can therefore serve as a parasitic antenna resonating element. At the same time, conductive structure 66 may, if desired, be used as a sensor electrode for a proximity sensor.

Transceiver circuitry 23 may be mounted to printed circuit board 79 and may be connected to the conductive lines in transmission line 44 via connector 81 and traces in board 79. Transmission line 44 may have positive and ground conductors and may be used in conveying radio-frequency antenna signals between transceiver 23 and feed terminals 76 and 78 of antenna 26.

Device 10 and antenna window 58 may have any suitable dimensions. For example, device 10 may have lateral dimensions of about 10-50 cm. Device 10 may be more than 2 cm thick, less than 2 cm thick, less than 1.5 cm thick, or less than 0.5 cm thick.

In thin device configurations, the removal of conductive housing portions in the immediate vicinity of antenna resonating element 68 helps ensure that antenna 26 will exhibit satisfactory efficiency and bandwidth (e.g., for supporting communications in wide bandwidth long-range communications bands such as cellular telephone communications bands).

Figure 5:
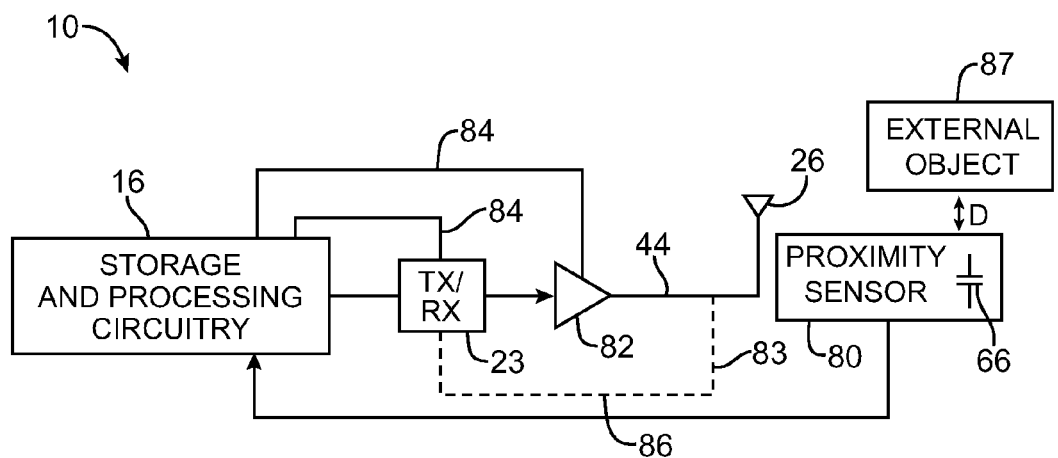
FIG. 5 is a diagram of an illustrative electronic device having an antenna and wireless circuitry that may reduce the amount of power transmitted through the antenna when a proximity sensor detects that an external object is within a given range of the antenna and the electronic device in accordance with an embodiment of the present invention.

A circuit diagram showing how a proximity sensor signal may be used in controlling the amount of power that is transmitted by antenna 26 is shown in FIG. 5. As shown in FIG. 5, device 10 may include storage and processing circuitry 16 (see, e.g., FIG. 3). Device 10 may also include a proximity sensor such as proximity sensor 80. Proximity sensor 80 may be implemented using any suitable type of proximity sensor technology (e.g., capacitive, optical, etc.). An advantage of capacitive proximity sensing techniques is that they can be relatively insensitive to changes in the reflectivity of external object 87.

As shown in the example of FIG. 5, proximity sensor 80 may contain a capacitor electrode formed from a conductive member such as conductive member 66 (FIG. 4). Conductive member 66 may, if desired, serve as a parasitic antenna resonating element for antenna 26.

Proximity sensor 80 may be mounted in housing 12 in the vicinity of antenna 26 (as shown in FIG. 4) to ensure that the signal from proximity sensor 80 is representative of the presence of external object 87 in the vicinity of antenna 26 (e.g., within a distance D of antenna 26 and/or device 10).

Output signals from proximity sensor 80 may be conveyed to storage and processing circuitry 16 using path 86. The signals from proximity sensor 80 may be analog or digital signals that provide proximity data to storage and processing circuitry 16. The proximity data may be Boolean data indicating that object 87 is or is not within a given predetermined distance of antenna 26 or may be continuous data representing a current estimated distance value for D.

Storage and processing circuitry 16 may be coupled to transceiver circuitry 23 and power amplifier circuitry 82. Dashed line 83 shows how received radio-frequency signals can be conveyed from antenna 26 to transceiver circuitry 23. During data transmission operations, control lines 84 may be used to convey control signals from storage and processing circuitry 16 to transceiver circuitry 23 and power amplifier circuitry 82 to adjust output powers in real time. For example, when data is being transmitted, transceiver 23 and is associated output amplifier 82 can be directed to increase or decrease the power level of the radio-frequency signal that is being provided to antenna 26 over transmission line 44 to ensure that regulatory limits for electromagnetic radiation emission are satisfied. If, for example, proximity sensor 80 does not detect the presence of external object 87, power can be provided at a relatively high (unrestricted) level. If, however, proximity sensor 80 determines that the user's leg or other body part or other external object 87 is in the immediate vicinity of antenna 26 (e.g., within 20 mm or less, within 15 mm or less, within 10 mm or less, etc.), storage and processing circuitry can respond accordingly by directing transceiver circuitry 23 and/or power amplifier 82 to transmit radio-frequency signals through antenna 26 at reduced powers.

Figure 6:
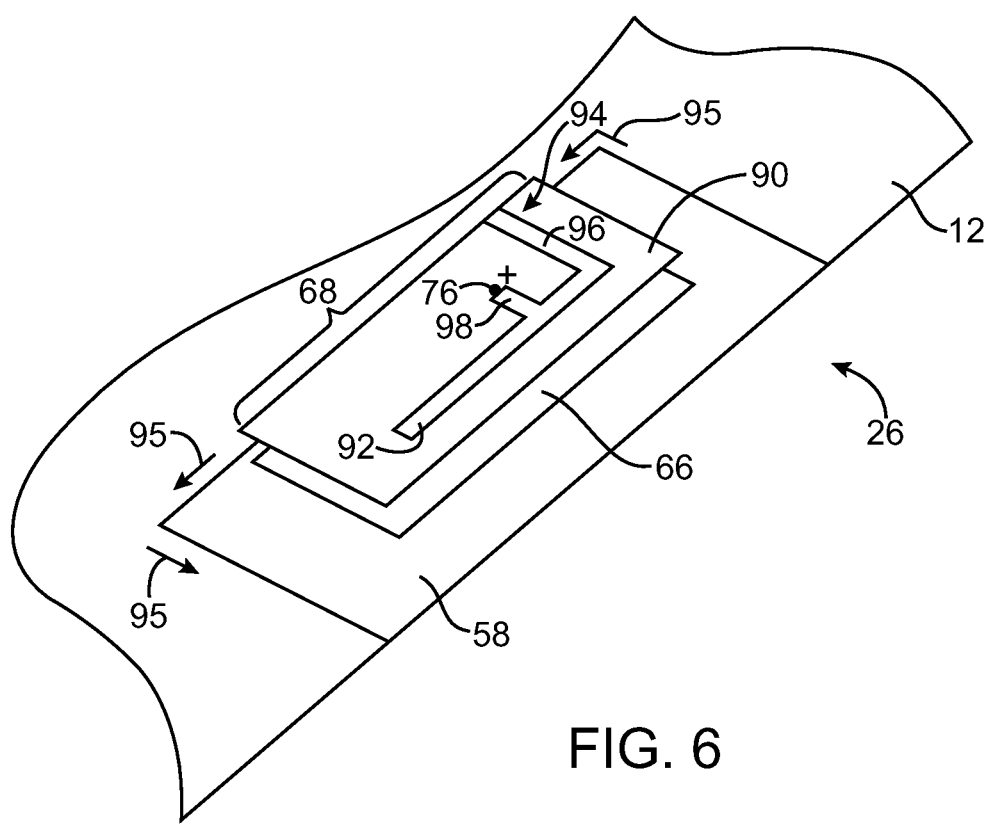
FIG. 6 is a perspective view of an illustrative antenna having an antenna resonating element and a parasitic antenna resonating element that overlap a dielectric antenna window in accordance with an embodiment of the present invention.

A perspective view of an illustrative antenna 26 is shown in FIG. 6. As shown in FIG. 6, antenna resonating element 68 may contain one or more conductive traces such as conductive trace 96. In the example of FIG. 6, antenna resonating element 68 has an inverted-F configuration. With this configuration, antenna resonating element 68 may have a dielectric substrate such as rigid or flexible printed circuit substrate 90 on which a conductive pattern has been formed such as conductive trace 94. Conductive trace 94 may have a main resonating element arm 92, a short circuit branch such as branch 96 that shorts arm 92 to ground (e.g., a path coupled to antenna feed terminal 78 of FIG. 4), and a branch 98 to which positive antenna feed terminal 76 is coupled. Arm 92 may, if desired, be provided with different shapes (e.g., multiple branches) to support operation in desired communications bands with desired bandwidths. The trace pattern for antenna resonating element 68 that is shown in FIG. 6 is merely illustrative. In general, any suitable type of antenna resonating element pattern may be used for antenna resonating element 68 if desired.

Antenna resonating element 68 may be mounted so as to overlap antenna window 58 and so as to lie under inactive region 54 of display 50 (FIG. 4). Conductive structure 66 may be interposed between antenna resonating element 68 and window 58.

During operation of antenna 26, the electromagnetic fields that are produced by antenna resonating element 68 may induce currents in conductive housing 12, such as currents 95 in the vicinity of window 58. If care is not taken, the relative shapes and sizes of the components of antenna 26 may give rise to undesirable concentrations of currents. This can, in turn, lead to undesirable hotspots in the near-field radiation pattern for antenna 26, as the induced currents re-radiate electromagnetic energy through antenna window 58.

Figure 7:
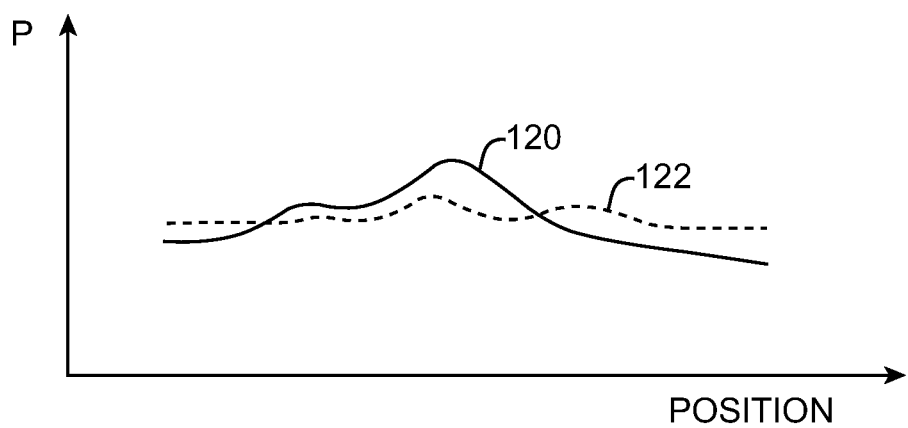
FIG. 7 is a graph showing how the presence of a parasitic antenna resonating element may help to reduce radio-frequency signal hotspots and thereby reduce near field radiation hotspots produced by an antenna in an electronic device in accordance with an embodiment of the present invention.

A graph that illustrates how antenna signals may exhibit undesirable hotspots is shown in FIG. 7. In the graph of FIG. 7, the power associated with near-field transmitted radio-frequency signals (e.g., signals for an antenna 26 that have been emitted in direction 72 or 71 through antenna window 58) is shown as a function of position (e.g., position along the inner edge of antenna window 58). Solid line 120 corresponds to a possible near-field radiation pattern in the absence of suitable antenna structures to reduce hotspots in currents 95 and associated hotspots in emitted radio-frequency signal powers. Dashed line 122 shows how hotspots can minimized or eliminated by inclusion of proper hotspot-reducing structures. Because dashed line 122 is smoother than line 120 and exhibits lower peak powers, dashed line 122 reflects a reduced spatial concentration of radio-frequency signal power. Smoothed radiation characteristics help antenna 26 to transmit desired amounts of signal power when communicating with a remote base station without exceeding regulatory limits for emitted radiation levels.

The near-field radiation pattern smoothing structures may include structures such as parasitic antenna resonating element 66. Ferrite tape 74 may also help to reduce hotspots and/or near-field signal intensities while allowing desired far-field antenna efficiency criteria to be satisfied. Proximity-sensor-based adjustments may be used in conjunction with these techniques if desired.

Parasitic antenna resonating element 66 may be formed from one or more conductive structures. Illustrative configurations for the conductive structures of a parasitic antenna resonating element 66 are shown in the top views of the interior of device 10 that are presented in FIGS. 8-13.

Figure 8:
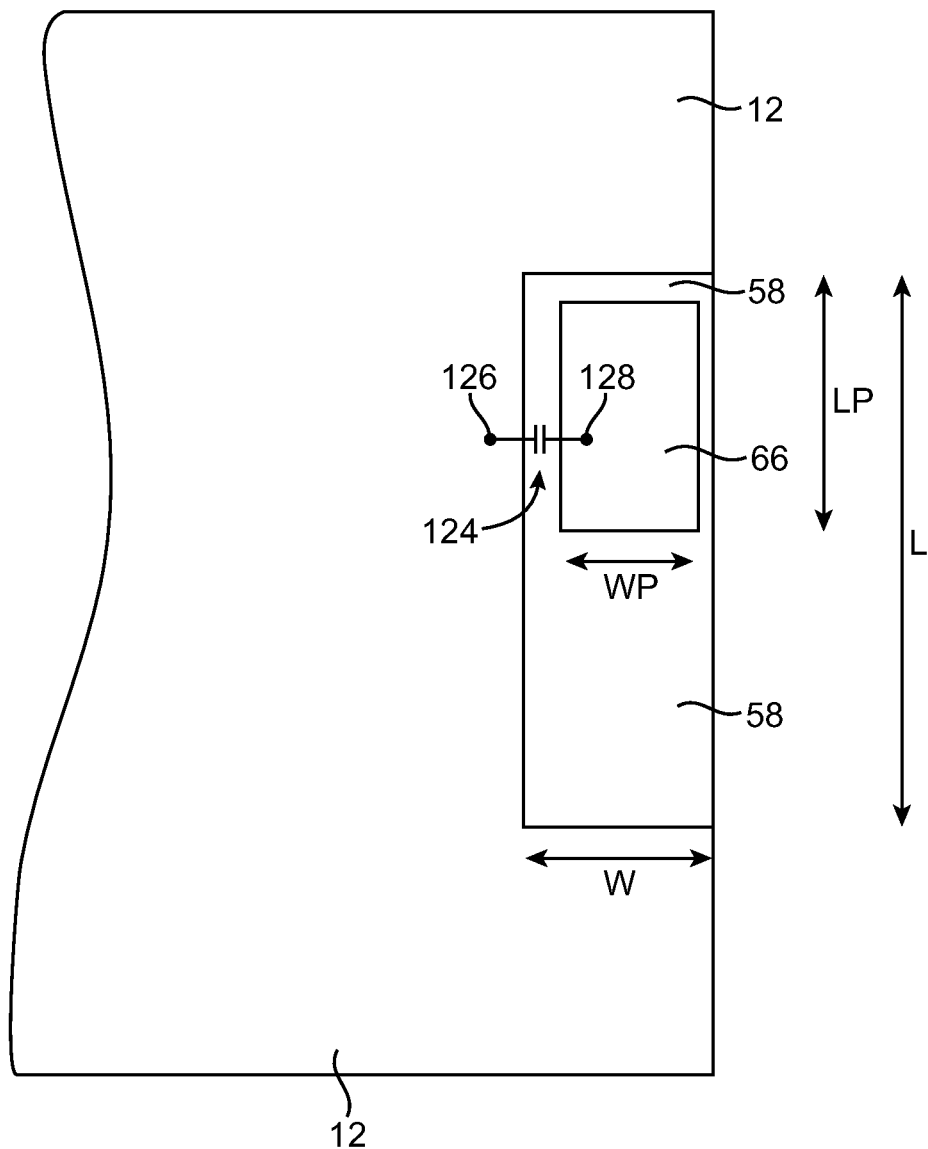
FIG. 8 is a top view of a parasitic antenna resonating element that has been coupled by a capacitor to a portion of a conductive device housing that is serving as antenna ground in accordance with an embodiment of the present invention.

FIG. 8 is a top view of parasitic antenna resonating element 66 in which the parasitic antenna resonating element is formed from a substantially rectangular conductive member (e.g., a rectangular patch). The patch may have lateral dimensions of LP and WP. Any suitable sizes may be used for dimensions LP and WP if desired. As an example, LP may be about 40 mm (e.g., 10-70 mm) and WP may be about 15 mm (e.g., about 5-25 mm). The outline of antenna window 58 may also be rectangular and may have any suitable dimensions. For example, the outline of antenna window 58 may have lateral dimensions of L and W. With one suitable arrangement, L may be about 80 mm (e.g., 50-110 mm) and W may be about 15 mm (e.g., about 5-25 mm).

Capacitor 124 may be coupled between housing 12 (e.g., the antenna ground) and parasitic antenna resonating element 66 using capacitor terminals 126 and 128. The capacitance of capacitor 124 may be selected to provide sufficient coupling between terminal 126 and terminal 128 and therefore housing 12 and element 66 at the operating frequencies of antenna 26 (e.g., at 850-2100 MHz, as an example). For example, the capacitance of capacitors such as capacitor 124 may be about 1-5 pF (i.e., less than 100 pF).

The location of terminals 126 and 128 and the coupling provided by capacitor 124 give rise to an impedance discontinuity along the paths of the induced currents in housing 12 (i.e., currents 95, which flow in housing 12 along the edge of housing 12 adjacent to antenna window 58, as shown in FIG. 6). Adjustments to the location and size of capacitor 124 and the size and shape of conductive structures of parasitic antenna resonating element structures 66 may be made to ensure that these impedance discontinuities cause antenna 26 to exhibit less pronounced hotspots and therefore exhibit improved compliance with regulatory limits on emitted radiation.

Figure 9:
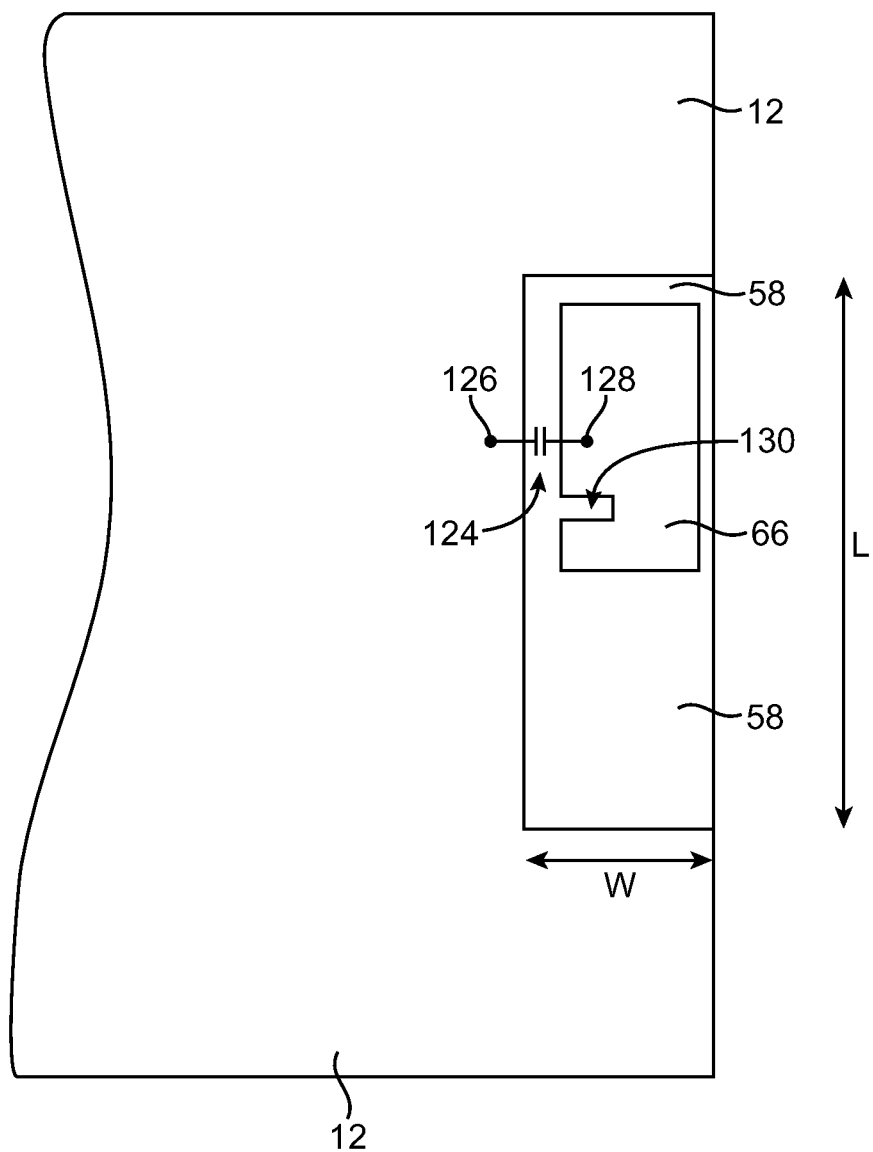
FIG. 9 is a top view of a notched parasitic antenna resonating element that has been coupled by a capacitor to a portion of a conductive device housing that is serving as antenna ground in accordance with an embodiment of the present invention.

In the example of FIG. 9, parasitic antenna resonating element 66 has a notch 130. Adjustments to the location and shape of features such as notch 130, bends, openings, or other characteristics of parasitic antenna resonating element 66 may be used to tune the performance of parasitic antenna resonating element in operating frequencies of interest.

Figure 10:
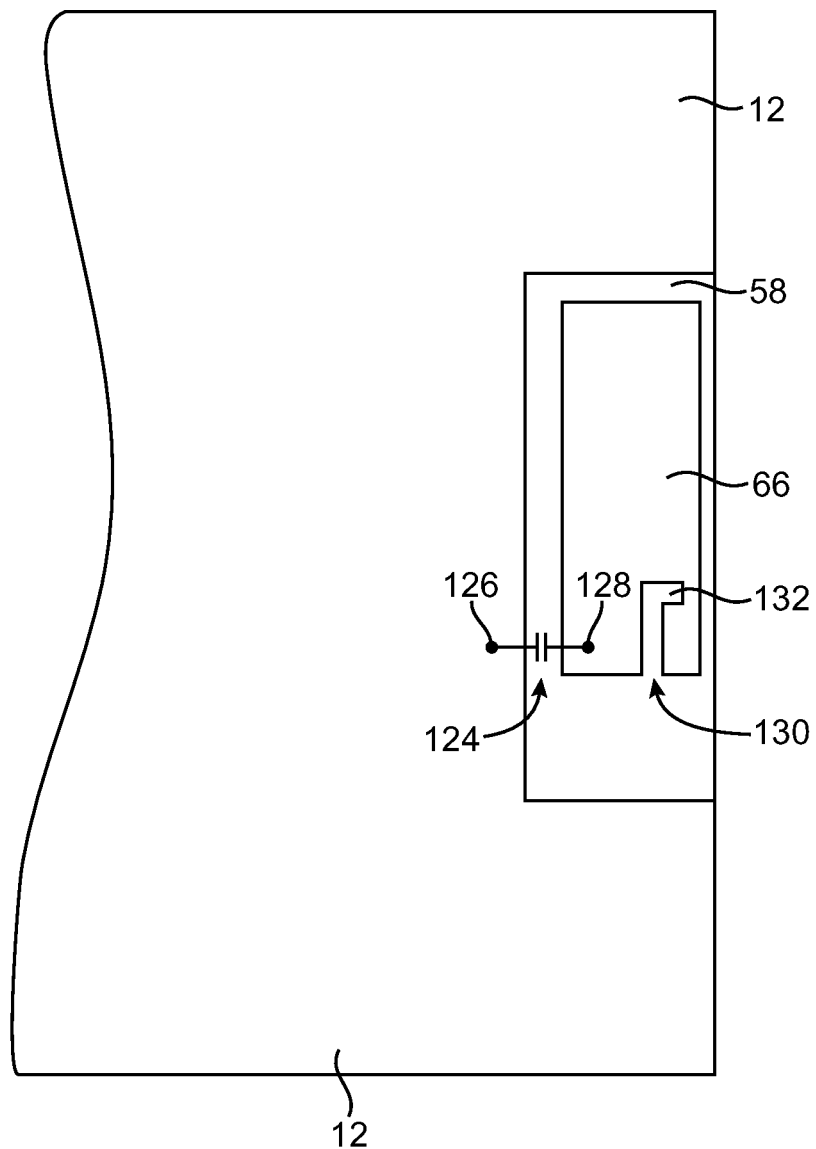
FIG. 10 is a top view of another notched parasitic antenna resonating element that has been coupled by a capacitor to a portion of a conductive device housing that is serving as antenna ground in accordance with an embodiment of the present invention.

FIG. 10 shows an illustrative configuration in which parasitic antenna resonating element 66 has been provided with a notch 130 on one of its narrower ends. The FIG. 10 example also shows how notch 130 may have an enlarged inner portion such as portion 132.

Figure 11:
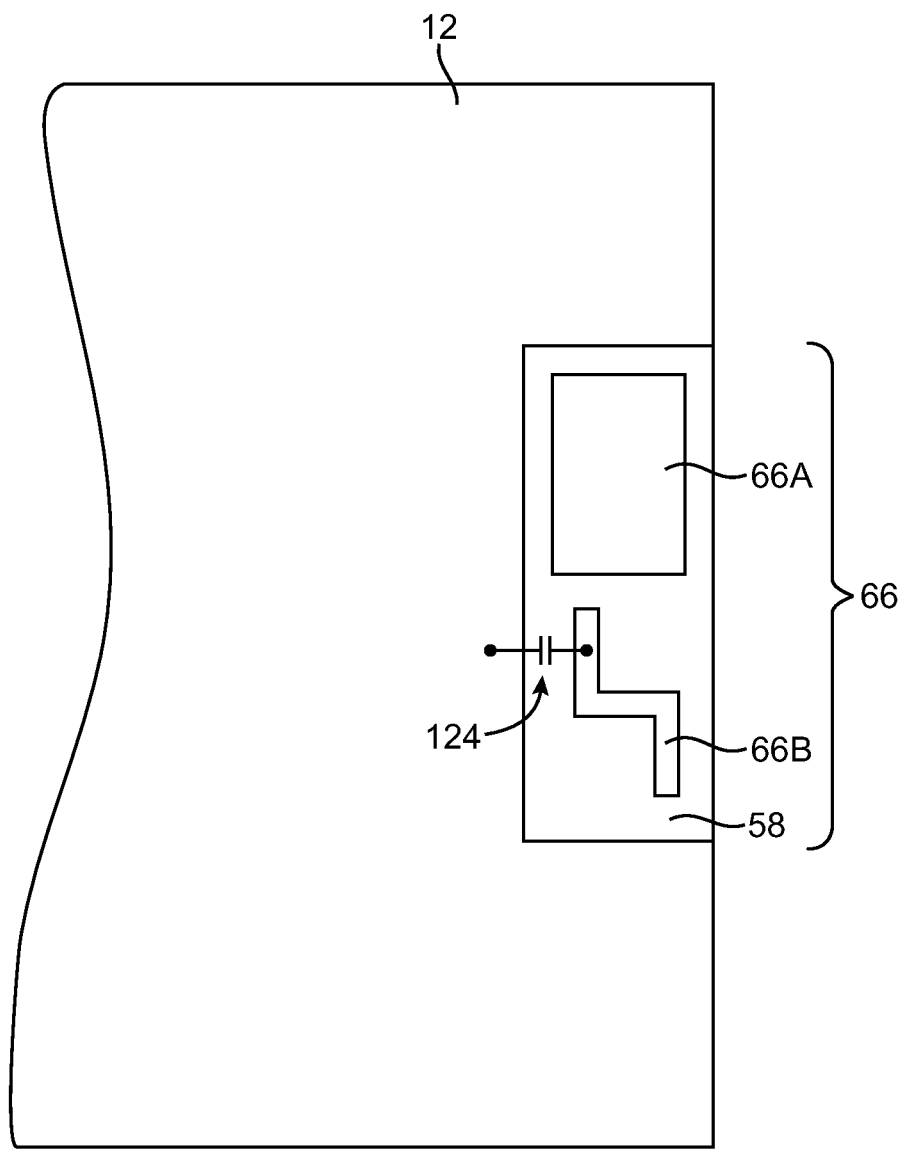
FIG. 11 is a top view of parasitic antenna resonating element structures having a rectangular conductor and an elongated bent conductor that has been coupled by a capacitor to a portion of a conductive device housing that is serving as antenna ground in accordance with an embodiment of the present invention.

In the illustrative arrangement of FIG. 11, parasitic antenna resonating element 66 has a first conductive member (rectangular conductive member 66A) and a second conductive member (bent elongated conductive member 66B). Capacitor 124 may be coupled to member 66A or 66B or two capacitors may be used, a first of which is connected between housing 12 and member 66A and a second of which is connected between housing 12 and member 66B (as an example).

There may, in general, be any suitable number of conductive members in parasitic antenna resonating element 66 (e.g., one conductive member, two conductive members, more than two conductive members, etc.). The use of two conductive members in parasitic antenna resonating element 66 of FIG. 11 is merely illustrative.

Figure 12:
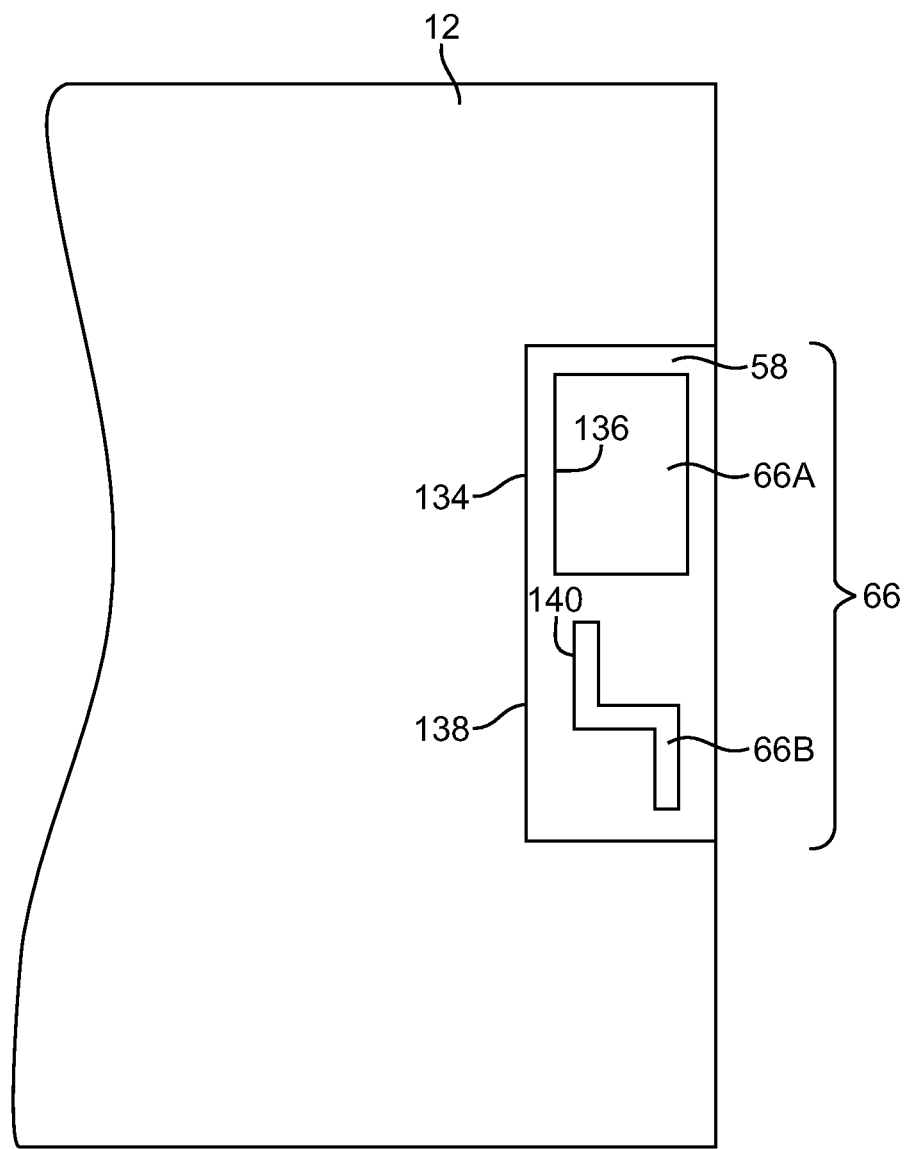
FIG. 12 is a top view of a parasitic antenna resonating element that includes a rectangular conductor and an elongated bent conductor that are coupled by parasitic capacitances to a portion of a conductive device housing that is serving as antenna ground in accordance with an embodiment of the present invention.

FIG. 12 shows how parasitic antenna element 66 may have one or more conductive members that are coupled to housing 12 using parasitic capacitances rather than discrete capacitors. With the FIG. 12 configuration, there is a first parasitic capacitance between conductive member 66A and housing 12 that is produced by the gap between opposing conductive edges 134 and 136. Similarly, there is a second parasitic capacitance between conductive member 66B and housing 12 that is produced by the gap between opposing conductive edges 138 and 140.

Figure 13:
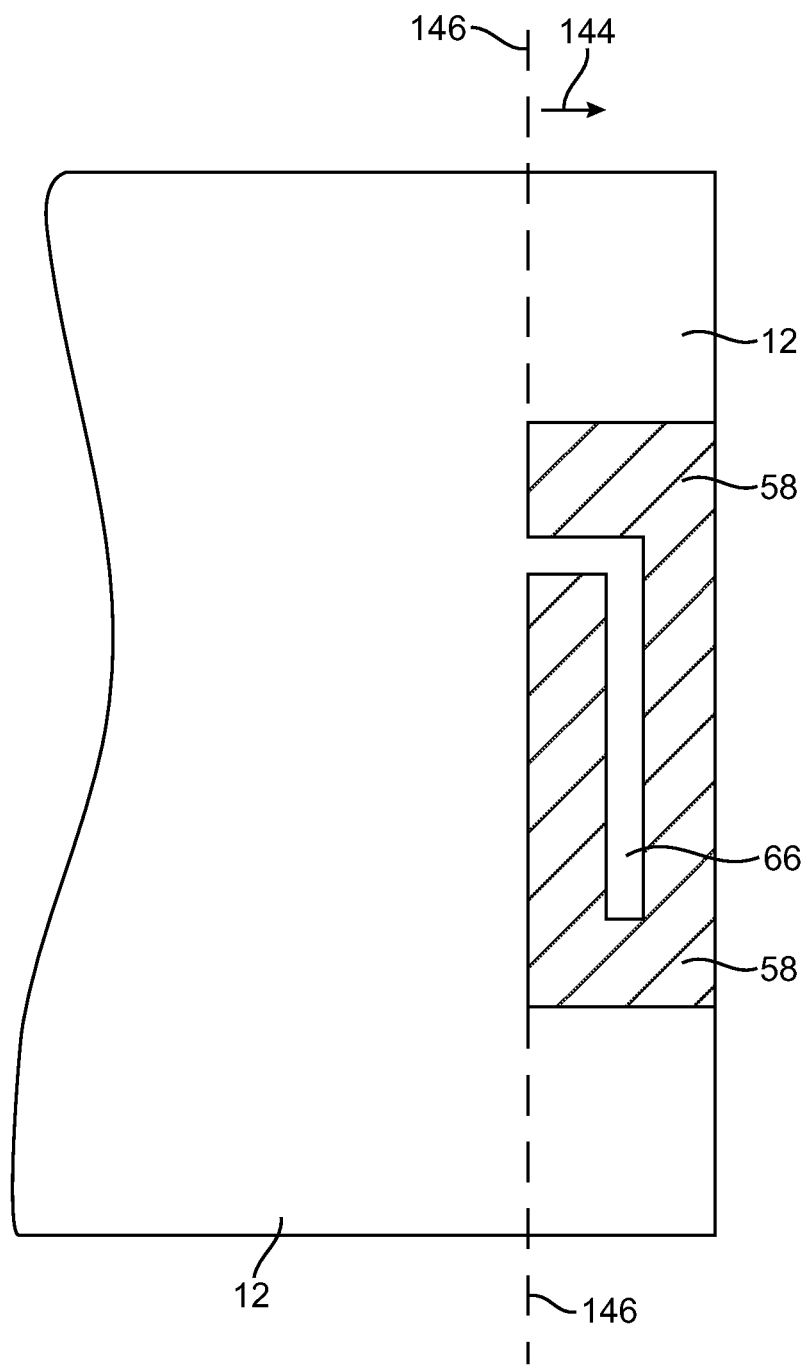
FIG. 13 is a top view of an illustrative antenna resonating element that may be formed from an elongated housing structure that overlaps or protrudes into a dielectric antenna window in accordance with an embodiment of the present invention.

If desired, parasitic antenna element 66 may be formed from a portion of housing 12. This type of arrangement is shown in FIG. 13. As shown in FIG. 13, antenna window 58 may have a rectangular outline (when viewed in the top view of FIG. 13). Dashed line 146 may separate the longest side of antenna window 58 from the conductive material of housing 12. Parasitic antenna resonating element 66 may be formed by an elongated portion of housing 12 that is integrally connected to housing 12 and that protrudes into window 58 in direction 144 to the right of line 146. Other arrangements may be used. For example, there may be two or more protruding housing portions that form parasitic antenna resonating element 66. The housing portions need not be elongated or bent as shown in FIG. 13. For example, the housing portions may be straight, serpentine, curved, rectangular, etc. These housing portions may, if desired, protrude into antenna window 58 from the shorter (upper and lower) sides of antenna window 58. Mixtures of these approaches may also be used (e.g., where there are one or more different types of housing protrusions combined with one or more of the parasitic antenna resonating element structures of FIGS. 8, 9, 10, and 11).

Parasitic antenna resonating elements of the types shown in FIGS. 8-13 may be formed from conductive traces on flex circuits or rigid printed circuit board substrates, from metal or other conductors formed directly on plastic support structures, from patterned metal foil, or using other suitable antenna structures. One or more of the conductive members in a given parasitic antenna resonating element 66 may serve as a proximity sensor electrode as well as a parasitic antenna resonating element.

The foregoing is merely illustrative of the principles of this invention and various modifications can be made by those skilled in the art without departing from the scope and spirit of the invention.

What is claimed is:

1. An electronic device having front and rear surfaces, comprising:
    a conductive housing;
    a dielectric antenna window in the conductive housing;
    an antenna resonating element mounted in the conductive housing so that radio-frequency signals are transmitted through the dielectric antenna window; and
    a parasitic antenna resonating element located between the antenna resonating element and the dielectric window, wherein the parasitic antenna resonating element comprises a capacitive proximity sensor electrode, wherein the capacitive proximity sensor electrode serves as a part of a capacitive proximity sensor and as at least a part of the parasitic antenna resonating element.

2. The electronic device defined in claim 1 wherein the dielectric antenna window comprises a plastic member mounted in the conductive housing.

3. A tablet computer comprising:
    a conductive housing;
    a dielectric antenna window in the conductive housing;
    radio-frequency transceiver circuitry;
    an antenna with which the radio-frequency transceiver circuitry transmits radio-frequency signals in at least one cellular telephone band, wherein the antenna comprises:
    an antenna ground formed from a portion of the conductive housing;
    an antenna resonating element mounted adjacent to the dielectric antenna window;
    a parasitic antenna resonating element formed from a planar metal member that is interposed between the antenna resonating element and the dielectric antenna window;

a capacitive proximity sensor that detects when an external object is in the vicinity of the antenna, wherein the parasitic antenna resonating element comprises a capacitor electrode in the capacitive proximity sensor a display mounted to the conductive housing, wherein the conductive housing forms a planar rear surface for the tablet computer, and wherein the display has a cover glass with an inactive region through which the radio-frequency signals are transmitted a capacitor connected between the conductive housing and the parasitic antenna resonating element; and a layer of ferrite interposed between the parasitic antenna resonating element and the dielectric antenna window.

4. The tablet computer defined in claim 3 wherein the parasitic antenna resonating element comprises at least two separate metal structures.

\* \* \* \* \*